(12) United States Patent
Calderoni et al.

(10) Patent No.: US 10,706,906 B2
(45) Date of Patent: Jul. 7, 2020

(54) CELL PERFORMANCE RECOVERY USING CYCLING TECHNIQUES

(71) Applicant: Micron Technology, Inc., Boise, ID (US)

(72) Inventors: Alessandro Calderoni, Boise, ID (US); Durai Vishak Nirmal Ramaswamy, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/044,310

(22) Filed: Jul. 24, 2018

(65) Prior Publication Data

US 2018/0358076 A1   Dec. 13, 2018

Related U.S. Application Data

(63) Continuation of application No. 15/693,032, filed on Aug. 31, 2017, now Pat. No. 10,141,040, which is a continuation of application No. 15/201,220, filed on Jul. 1, 2016, now Pat. No. 9,786,349.

(51) Int. Cl.
  *G11C 11/22* (2006.01)
(52) U.S. Cl.
  CPC ........ *G11C 11/2273* (2013.01); *G11C 11/221* (2013.01); *G11C 11/2257* (2013.01); *G11C 11/2259* (2013.01); *G11C 11/2275* (2013.01); *G11C 11/2293* (2013.01)
(58) Field of Classification Search
  CPC ............ G11C 11/2273; G11C 11/2275; G11C 11/2257; G11C 11/221
  See application file for complete search history.

(56) References Cited

U.S. PATENT DOCUMENTS

| | | |
|---|---|---|
| 6,238,933 B1 | 5/2001 | Sun et al. |
| 6,456,098 B1 | 9/2002 | Pöchmüller |
| 6,473,330 B1 | 10/2002 | Ogiwara et al. |
| 7,215,565 B2 * | 5/2007 | Karlsson ................. G11C 11/22 365/145 |
| 7,248,528 B2 | 7/2007 | Riho et al. |
| 7,869,270 B2 | 1/2011 | Lee |

(Continued)

OTHER PUBLICATIONS

Colla, et al., "DC-voltage and cycling induced recovery of switched polarisation in fatigued ferroelectric thin films", Integrated Ferroelectrics, 1995, OPA Amsterdam B.V., The Netherlands., 289-294, vol. 10.

(Continued)

*Primary Examiner* — Vanthu T Nguyen
(74) *Attorney, Agent, or Firm* — Holland & Hart LLP

(57) ABSTRACT

Methods, systems, and devices for memory array operation are described. A series of pulses may be applied to a fatigued memory cell to improve performance of memory cell. For example, a ferroelectric memory cell may enter a fatigue state after a number of access operations are performed at an access rate. After the number of access operations have been performed at the access rate, a fatigue state of the ferroelectric memory cell may be identified and the series of pulses may be applied to the ferroelectric capacitor at a different (e.g., higher) rate. For instance, a delay between pulses of the series of pulses may be shorter than the delay between access operations of the ferroelectric memory cell.

20 Claims, 8 Drawing Sheets

(56) References Cited

U.S. PATENT DOCUMENTS

| | | |
|---|---|---|
| 7,982,466 B2 | 7/2011 | Hikosaka et al. |
| 8,462,580 B2 | 6/2013 | Rabkin et al. |
| 8,654,559 B2 | 2/2014 | Nakano et al. |
| 9,064,573 B2 | 6/2015 | Kawai et al. |
| 9,202,565 B2 | 12/2015 | Kawai et al. |
| 2008/0126685 A1 | 5/2008 | Danilak |
| 2015/0363257 A1 | 12/2015 | Kwon et al. |

OTHER PUBLICATIONS

Ozgul, et al., "Influence of electrical cycling on polarization reversal processes in Pb(Zn1/3Nb2/3)O3—PbTiO3 ferroelectric single crystals as a function of orientation", Journal of Applied Physics, Apr. 15, 2004, vol. 95, No. 8, 2004 American Institute of Physics., 8 pgs.

Pawlaczyk, et al., "Fatigue, rejuvenation and self-restoring in ferroelectric thin films", Integrated Ferroelectrics, 1995, vol. 8, 1995 OPA Amsterdam B.V., The Netherlands, pp. 293-316.

Schloss, et al., "Polarization recovery of fatigued Pb(Zr,Ti)O3 thin films: Switching current studies", Journal of Applied Physics, Feb. 1, 2006, vol. 93, No. 3, American Institute of Physics, 6 pgs.

\* cited by examiner

CELL PERFORMANCE RECOVERY USING CYCLING TECHNIQUES

CROSS REFERENCE

The present Application for Patent is a continuation of U.S. patent application Ser. No. 15/693,032 by Calderoni et al., entitled "Cell Performance Recovery Using Cycling Techniques," filed Aug. 31, 2017, which is a continuation of U.S. patent application Ser. No. 15/201,220 by Calderoni et al., entitled "Cell Performance Recovery Using Cycling Techniques," filed Jul. 1, 2016, assigned to the assignee hereof, and each of which is expressly incorporated by reference in its entirety herein.

BACKGROUND

The following relates generally to memory devices and more specifically to recovery of a fatigued ferroelectric memory cell using cycling techniques.

Memory devices are widely used to store information in various electronic devices such as computers, wireless communication devices, cameras, digital displays, and the like. Information is stored by programming different states of a memory device. For example, binary devices have two states, often denoted by a logic "1" or a logic "0." In other systems, more than two states may be stored. To access the stored information, the electronic device may read, or sense, the stored state in the memory device. To store information, the electronic device may write, or program, the state in the memory device.

Various types of memory devices exist, including random access memory (RAM), read only memory (ROM), dynamic RAM (DRAM), synchronous dynamic RAM (SDRAM), ferroelectric RAM (FeRAM), magnetic RAM (MRAM), resistive RAM (RRAM), flash memory, and others. Memory devices may be volatile or non-volatile. Non-volatile memory (e.g., flash memory) can store data for extended periods of time even in the absence of an external power source. Volatile memory devices (e.g., DRAM) may lose their stored state over time unless they are periodically refreshed by an external power source. A binary memory device may, for example, include a charged or discharged capacitor. A charged capacitor may, however, become discharged over time through leakage currents, resulting in the loss of the stored information. Certain features of volatile memory may offer performance advantages, such as faster read or write speeds, while features of non-volatile memory, such as the ability to store data without periodic refreshing, may be advantageous.

FeRAM may use similar device architectures as volatile memory but may have non-volatile properties due to the use of a ferroelectric capacitor as a storage device. FeRAM devices may thus have improved performance compared to other non-volatile and volatile memory devices. A ferroelectric capacitor of an FeRAM device may experience degraded performance over its life of operation, which may be known as "fatigue." A fatigue state of the memory cell may be associated with decreased amounts of charge being stored by the ferroelectric capacitor when no voltage is applied across the ferroelectric capacitor. And as a result, a sensing window associated with reading a logic state of the memory cell may also be decreased. In some cases, the average duration between access operations performed on the ferroelectric memory cell impacts the fatigue state of the ferroelectric memory cell.

BRIEF DESCRIPTION OF THE DRAWINGS

The disclosure herein refers to and includes the following figures.

DETAILED DESCRIPTION

A series of voltage pulses may be applied to a fatigued memory cell to improve the performance of the cell. For example, a ferroelectric memory cell may be accessed—e.g., for read or write operations—at an access rate associated with an application or a function of the ferroelectric memory cell, such as a random access memory function. After a number of access operations has occurred at the access rate, the ferroelectric memory cell may enter a fatigue state during which the remnant polarization level of the ferroelectric capacitor is reduced relative to prior access operations. In the fatigue state, the amount of charge stored by the ferroelectric capacitor when no voltage is applied across the ferroelectric capacitor may be reduced with each successive access operation.

The fatigue state may be identified or estimated and a series of voltage pulses may be applied to the ferroelectric capacitor to recover the remnant polarization levels. The series of pulses may have an increased frequency relative to the frequency of access operations. For instance, pulses of the series may be separated in time by a duration that is shorter than a delay, or an average delay, between the access operations of the ferroelectric memory cell. The number of applied pulses or the frequency of the applied pules may be based on the resulting remnant polarization and the number of access operations previously performed on the ferroelectric capacitor.

Features of the disclosure introduced above are further described below in the context of a memory array. Specific examples are then described for an example circuit and corresponding diagrams for recovering a memory cell using cycling techniques. These and other features of the disclosure are further illustrated by and described with reference to apparatus diagrams, system diagrams, and flowcharts that relate to recovery of a ferroelectric memory cell using cycling techniques.

Figure 1:
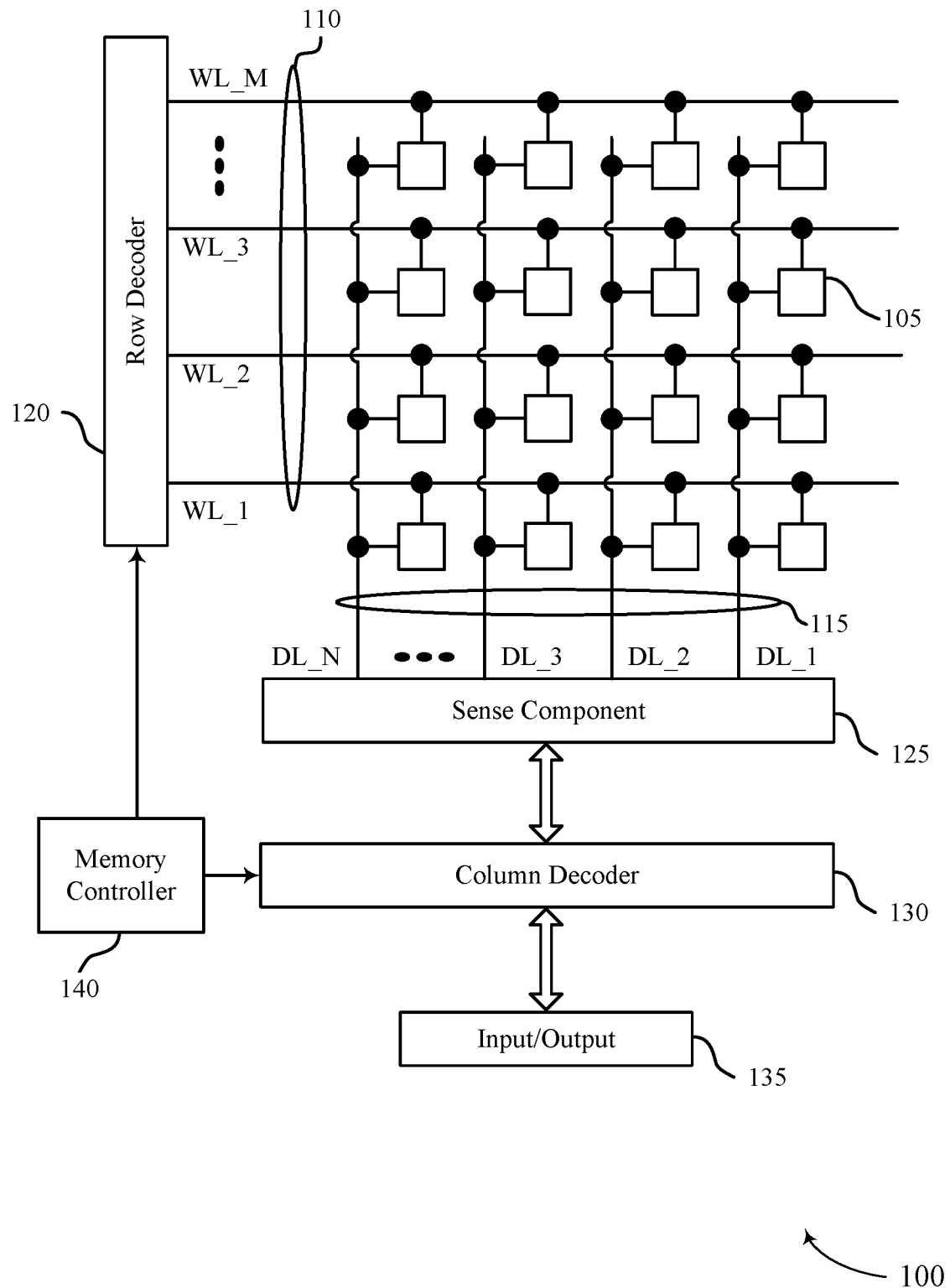
FIG. 1 illustrates an example memory array that supports recovery of a memory cell using cycling techniques in accordance with various embodiments of the present disclosure.

FIG. 1 illustrates an example memory array 100 that supports recovery of a memory cell using cycling techniques in accordance with various embodiments of the present disclosure. Memory array 100 may also be referred to as an electronic memory apparatus. Memory array 100 includes memory cells 105 that are programmable to store different states. Each memory cell 105 may be programmable to store two states, denoted as a logic 0 and a logic 1. In some cases, memory cell 105 is configured to store more than two logic states. A memory cell 105 may include a capacitor to store a charge representative of the programmable states; for example, a charged and uncharged capacitor may represent two logic states, respectively. DRAM architectures may commonly use such a design, and the capacitor employed may include a dielectric material with linear electric polarization properties. By contrast, a ferroelectric memory cell may include a capacitor that has a ferroelectric as the dielectric material. Different levels of charge of a ferroelectric capacitor may represent different logic states. Ferroelectric materials have non-linear polarization properties; some details and advantages of a ferroelectric memory cell 105 are discussed below.

Access operations such as reading and writing may be performed on memory cells 105 by activating or selecting the appropriate word line 110 and digit line 115. Word lines 110 may also be referred to as access lines and digit lines 115 may also be referred to as bit lines. Activating or selecting a word line 110 or a digit line 115 may include applying a voltage to the respective line. Word lines 110 and digit lines 115 are made of conductive materials. For example, word lines 110 and digit lines 115 may be made of metals (such as copper, aluminum, gold, tungsten, etc.), metal alloys, other conductive materials, or the like. According to the example of FIG. 1, each row of memory cells 105 is connected to a single word line 110, and each column of memory cells 105 is connected to a single digit line 115. By activating one word line 110 and one digit line 115 (e.g., applying a voltage to the word line 110 or digit line 115), a single memory cell 105 may be accessed at their intersection. Accessing the memory cell 105 may include reading or writing the memory cell 105. The intersection of a word line 110 and digit line 115 may be referred to as an address of a memory cell.

In some architectures, the logic storing device of a cell, e.g., a capacitor, may be electrically isolated from the digit line by a selection component. The word line 110 may be connected to and may control the selection component. For example, the selection component may be a transistor and the word line 110 may be connected to the gate of the transistor. Activating the word line 110 results in an electrical connection or closed circuit between the capacitor of a memory cell 105 and its corresponding digit line 115. The digit line may then be accessed to either read or write the memory cell 105.

Accessing memory cells 105 may be controlled through a row decoder 120 and a column decoder 130. In some examples, a row decoder 120 receives a row address from the memory controller 140 and activates the appropriate word line 110 based on the received row address. Similarly, a column decoder 130 receives a column address from the memory controller 140 and activates the appropriate digit line 115. For example, memory array 100 may include multiple word lines 110, labeled WL_1 through WL_M, and multiple digit lines 115, labeled DL_1 through DL N, where M and N depend on the array size. Thus, by activating a word line 110 and a digit line 115, e.g., WL_2 and DL_3, the memory cell 105 at their intersection may be accessed.

Upon accessing, a memory cell 105 may be read, or sensed, by sense component 125 to determine the stored state of the memory cell 105. For example, after accessing the memory cell 105, the ferroelectric capacitor of memory cell 105 may discharge onto its corresponding digit line 115. Discharging the ferroelectric capacitor may be based on biasing, or applying a voltage, to the ferroelectric capacitor. The discharging may induce a change in the voltage of the digit line 115, which sense component 125 may compare to a reference voltage (not shown) in order to determine the stored state of the memory cell 105. For example, if digit line 115 has a higher voltage than the reference voltage, then sense component 125 may determine that the stored state in memory cell 105 was a logic 1 and vice versa. Sense component 125 may include various transistors or amplifiers in order to detect and amplify a difference in the signals, which may be referred to as latching. The detected logic state of memory cell 105 may then be output through column decoder 130 as input/output 135.

A memory cell 105 may be set, or written, by activating the relevant word line 110 and digit line 115. As discussed above, activating a word line 110 electrically connects the corresponding row of memory cells 105 to their respective digit lines 115. By controlling the relevant digit line 115 while the word line 110 is activated, a memory cell 105 may be written—i.e., a logic value may be stored in the memory cell 105. Column decoder 130 may accept data, for example input/output 135, to be written to the memory cells 105. A ferroelectric memory cell 105 may be written by applying a voltage across the ferroelectric capacitor. This process is discussed in more detail below.

In some memory architectures, accessing the memory cell 105 may degrade or destroy the stored logic state and re-write or refresh operations may be performed to return the original logic state to memory cell 105. In DRAM, for example, the capacitor may be partially or completely discharged during a sense operation, corrupting the stored logic state. So the logic state may be re-written after a sense operation. Additionally, activating a single word line 110 may result in the discharge of all memory cells in the row; thus, several or all memory cells 105 in the row may need to be re-written.

Some memory architectures, including DRAM, may lose their stored state over time unless they are periodically refreshed by an external power source. For example, a charged capacitor may become discharged over time through leakage currents, resulting in the loss of the stored information. The refresh rate of these so-called volatile memory devices may be relatively high, e.g., tens of refresh operations per second may be employed for refresh operations for DRAM arrays, which may result in significant power consumption. With increasingly larger memory arrays, increased power consumption may inhibit the deployment or operation of memory arrays (e.g., power supplies, heat generation, material limits, etc.), especially for mobile devices that rely on a finite power source, such as a battery. As discussed below, ferroelectric memory cells 105 may have beneficial properties that may result in improved performance relative to other memory architectures.

For instance, ferroelectric memory cells 105 may be capable of a larger number of operating cycles (e.g., read/ write cycles) relative to DRAM memory cells. As discussed above, access operations (e.g., read and write operations) involve application of a voltages across a ferroelectric capacitor of the ferroelectric memory cell 105, which causes the ferroelectric capacitor to store charge or to release charge onto a digit line 115. Over the life of the ferroelectric memory cell 105 and after a number of access operations have been performed, the ferroelectric memory cell 105 may experience a reduction in the amount of charge that is stored by the ferroelectric capacitor when no voltage is applied across the ferroelectric capacitor (e.g., the remnant polarization). As mentioned above, the decrease in the remnant polarization over time may be referred to as "fatigue" of the ferroelectric memory cell 105. This decrease in the remnant polarization may be a result of "imprint" of domains within the ferroelectric capacitor.

In some examples, the number of cycles and the elapsed time prior to a state of fatigue may be associated with the number and rate of access operations performed on the ferroelectric memory cell 105. In some examples, a lower rate of access (i.e., the longer the delay between access operations) is associated with a fewer number of access operations being performed prior to the ferroelectric memory cell 105 entering a state of fatigue. The decrease in the amount of stored charge may result in a decreased sensing window and an increase in read operation failures, which may also correspond with the end of the operating life for the ferroelectric memory cell 105.

Recovery techniques may be used to remove the imprinted domains from the ferroelectric capacitor. In some cases, the operating life of a ferroelectric memory cell 105 may be further extended by applying cycling recovery techniques to a fatigued ferroelectric memory cell 105. For example, after identifying an average access rate of the ferroelectric memory cell 105 and identifying the ferroelectric memory cell 105 has reached a state of fatigue, a series of pulses may be applied to the ferroelectric memory cell 105. Applying the series of pulses may increase the remnant polarization and counter the effects of fatigue of the ferroelectric capacitor. This countering of fatigue may be referred to as "recovery" of the ferroelectric memory cell 105. The series of pulses applied for recovery may be separated by a duration that is shorter than the average duration between access operations performed on ferroelectric memory cell 105. The series of pulses may be applied until the remnant polarization of the ferroelectric capacitor is increased relative to the remnant polarization during the fatigue state. After performing the cycling recovery, the ferroelectric memory cell 105 may resume access of the ferroelectric memory cell 105 in accordance with the average access rate.

The memory controller 140 may control the operation (e.g., read, write, re-write, refresh, etc.) of memory cells 105 through the various components, such as row decoder 120, column decoder 130, and sense component 125. Memory controller 140 may generate row and column address signals in order to activate the desired word line 110 and digit line 115. Memory controller 140 may also generate and control various voltage potentials used during the operation of memory array 100. In general, the amplitude, shape, or duration of an applied voltage discussed herein may be adjusted or varied and may be different for the various operations for operating memory array 100. Furthermore, one, multiple, or all memory cells 105 within memory array 100 may be accessed simultaneously; for example, multiple or all cells of memory array 100 may be accessed simultaneously during a reset operation in which all memory cells 105, or a group of memory cells 105, are set to a single logic state.

In some cases, the memory controller 140 may be used to support recovery of a memory cell 105 using cycling. For instance, memory controller 140 may be used to perform access operations of the memory cell 105, identify a fatigue state of the memory cell 105, and apply a series of pulses to the memory cell 105 to recover the memory cell 105 when the memory cell 105 enters the fatigue state. In some cases, the memory controller 140 may identify that the fatigue state has occurred or when the fatigue state will occur based on a number of and/or a rate of access operations of the ferroelectric memory cell. The rate of access operations may be associated with a time delay, or an average time delay, between access operations and, in some cases, may be based on an operating function of the memory cell 105. The series of pulses may be applied so that the a time delay between pulses is less than the time delay associated with the access rate and may be applied after identifying the memory cell 105 has entered or is approaching the fatigue state. After the series of pulses has been applied, memory controller 140 may resume operation of the memory cell at the original access rate.

Figure 2:
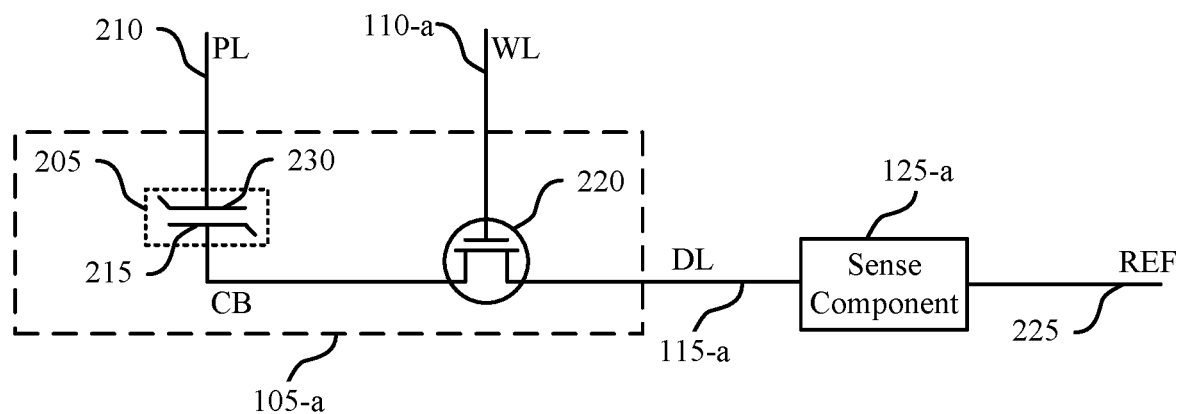
FIG. 2 illustrates an example circuit of a memory cell that is recovered using cycling techniques in accordance with various embodiments of the present disclosure.

FIG. 2 illustrates an example circuit 200 that includes a memory cell 105 that is recovered using cycling techniques in accordance with various embodiments of the present disclosure. Circuit 200 includes a memory cell 105-a, word line 110-a, digit line 115-a, and sense component 125-a, which may be examples of a memory cell 105, word line 110, digit line 115, and sense component 125, respectively, as described with reference to FIG. 1. Memory cell 105-a may include a logic storage component, such as capacitor 205 that has a first plate, cell plate 230, and a second plate, cell bottom 215. Cell plate 230 and cell bottom 215 may be capacitively coupled through a ferroelectric material positioned between them. The orientation of cell plate 230 and cell bottom 215 may be flipped without changing the operation of memory cell 105-a. Circuit 200 also includes selection component 220 and reference line 225 (or reference signal). In the example of FIG. 2, cell plate 230 may be accessed via plate line 210 and cell bottom 215 may be accessed via digit line 115-a. As described above, various states may be stored by charging or discharging capacitor 205.

The stored state of capacitor 205 may be read or sensed by operating various elements represented in circuit 200. Capacitor 205 may be in electronic communication with digit line 115-a. For example, capacitor 205 can be isolated from digit line 115-a when selection component 220 is deactivated, and capacitor 205 can be connected to digit line 115-a when selection component 220 is activated. Activating selection component 220 may be referred to as selecting memory cell 105-a. In some cases, selection component 220 is a transistor and its operation is controlled by applying a voltage to the transistor gate, where the voltage magnitude is greater than the threshold magnitude of the transistor. Word line 110-a may activate selection component 220; for example, a voltage applied to word line 110-a is applied to the transistor gate, connecting capacitor 205 with digit line 115-a. In an alternative embodiment, the positions of selection component 220 and capacitor 205 may be switched, such that selection component 220 is connected between plate line 210 and cell plate 230 and such that capacitor 205 is between digit line 115-a and the other terminal of selection component 220. In this embodiment, selection component 220 may remain in electronic communication with digit line 115-a through capacitor 205. This configuration may be associated with alternative timing and biasing for read and write operations.

Due to the ferroelectric material between the plates of capacitor 205, and as discussed in more detail below, capacitor 205 may not discharge upon connection to digit line 115-a. In one scheme, to sense the logic state stored by ferroelectric capacitor 205, word line 110-a may be biased to select memory cell 105-a and a voltage may be applied to plate line 210. In some cases, digit line 115-a is virtually grounded and then isolated from the virtual ground (i.e., "floating") prior to biasing plate line 210 and word line 110-a. Biasing plate line 210 may result in a voltage difference (e.g., plate line 210 voltage minus digit line 115-a voltage) across capacitor 205. The voltage difference may yield a change in the stored charge on capacitor 205, where the magnitude of the change in stored charge may depend on the initial state of capacitor 205—e.g., whether the initial state stored a logic 1 or a logic 0. This may cause a change in the voltage of digit line 115-a based on the charge stored on capacitor 205. Operation of memory cell 105-a by varying the voltage to cell plate 230 may be referred to as "moving cell plate."

The change in voltage of digit line 115-a may depend on its intrinsic capacitance. That is, as charge flows through digit line 115-a, some finite charge may be stored in digit line 115-a and the resulting voltage depends on the intrinsic capacitance. The intrinsic capacitance may depend on physical characteristics, including the dimensions, of digit line 115-a. Digit line 115-a may connect many memory cells 105 so digit line 115-a may have a length that results in a non-negligible capacitance (e.g., on the order of picofarads (pF)). The resulting voltage of digit line 115-a may then be compared to a reference (e.g., a voltage of reference line 225) by sense component 125-a in order to determine the stored logic state in memory cell 105-a. Other sensing processes may be used.

Sense component 125-a may include various transistors or amplifiers to detect and amplify a difference in signals, which may be referred to as latching. Sense component 125-a may include a sense amplifier that receives and compares the voltage of digit line 115-a and reference line 225, which may be a reference voltage. The sense amplifier output may be driven to the higher (e.g., a positive) or lower (e.g., negative or ground) supply voltage based on the comparison. For instance, if digit line 115-a has a higher voltage than reference line 225, then the sense amplifier output may be driven to a positive supply voltage. In some cases, the sense amplifier may additionally drive digit line 115-a to the supply voltage. Sense component 125-a may then latch the output of the sense amplifier and/or the voltage of digit line 115-a, which may be used to determine the stored state in memory cell 105-a, e.g., logic 1. Alternatively, if digit line 115-a has a lower voltage than reference line 225, the sense amplifier output may be driven to a negative or ground voltage. Sense component 125-a may similarly latch the sense amplifier output to determine the stored state in memory cell 105-a, e.g., logic 0. The latched logic state of memory cell 105-a may then be output, for example, through column decoder 130 as input/output 135 with reference to FIG. 1.

To write memory cell 105-a, a voltage may be applied across capacitor 205. Various methods may be used. In one example, selection component 220 may be activated through word line 110-a in order to electrically connect capacitor 205 to digit line 115-a. A voltage may be applied across capacitor 205 by controlling the voltage of cell plate 230 (through plate line 210) and cell bottom 215 (through digit line 115-a). To write a logic 0, cell plate 230 may be taken high, that is, a positive voltage may be applied to plate line 210, and cell bottom 215 may be taken low, e.g., virtually grounding or applying a negative voltage to digit line 115-a. The opposite process is performed to write a logic 1, where cell plate 230 is taken low and cell bottom 215 is taken high.

In some examples, a series of pulses may be applied to memory cell 105-a via plate line 210 to perform recovery procedures for memory cell 105-a. The series of pulses may be used to apply voltages of alternating polarities across capacitor 205 at a rate that is faster than an access rate used in standard operation of memory cell 105-a. Applying the voltages of alternating polarities may be implemented using a combination of the reading/writing techniques described above. For instance, to apply a positive voltage across capacitor 205, where the voltage across capacitor 205 is defined as cell plate 230 minus cell bottom 215, a voltage may be applied to plate line 210 while digit line 115-a is maintained at virtual ground. To apply a negative voltage across capacitor 205, digit line 115-a may be driven to a high voltage while plate line 210 is maintained at virtual ground.

Figure 3:
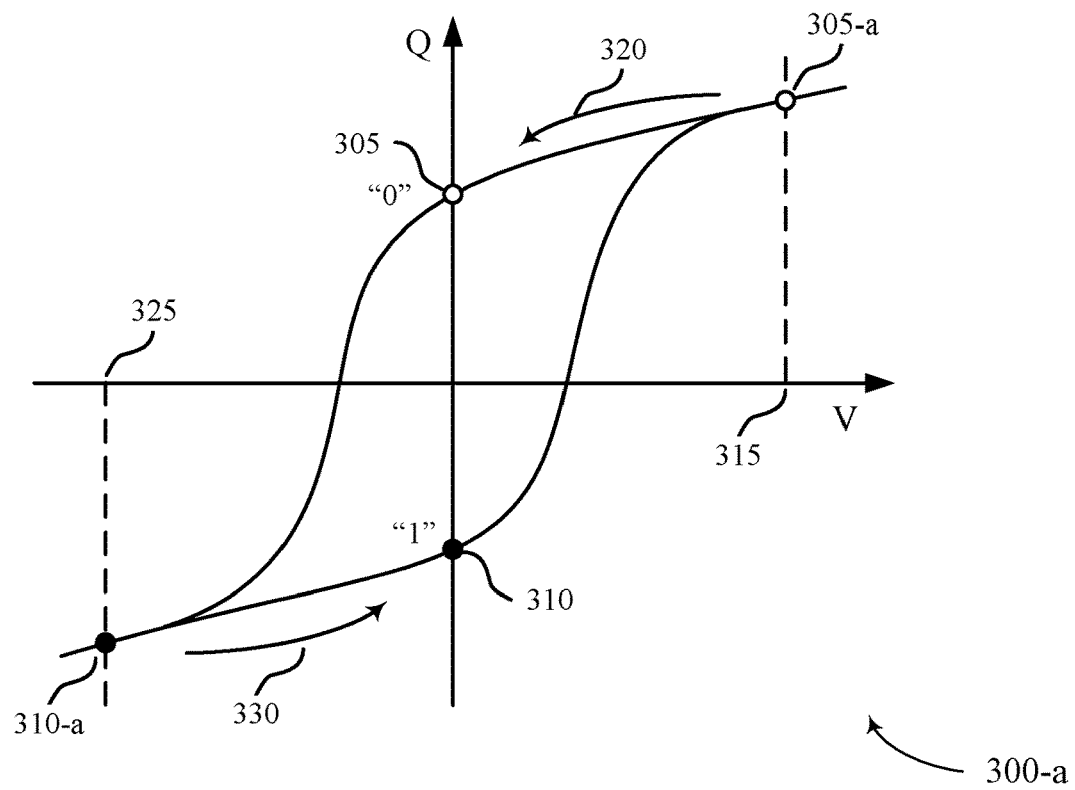
FIG. 3 illustrates example hysteresis plots for a ferroelectric memory cell that is recovered using cycling techniques in accordance with various embodiments of the present disclosure.
Figure 3:
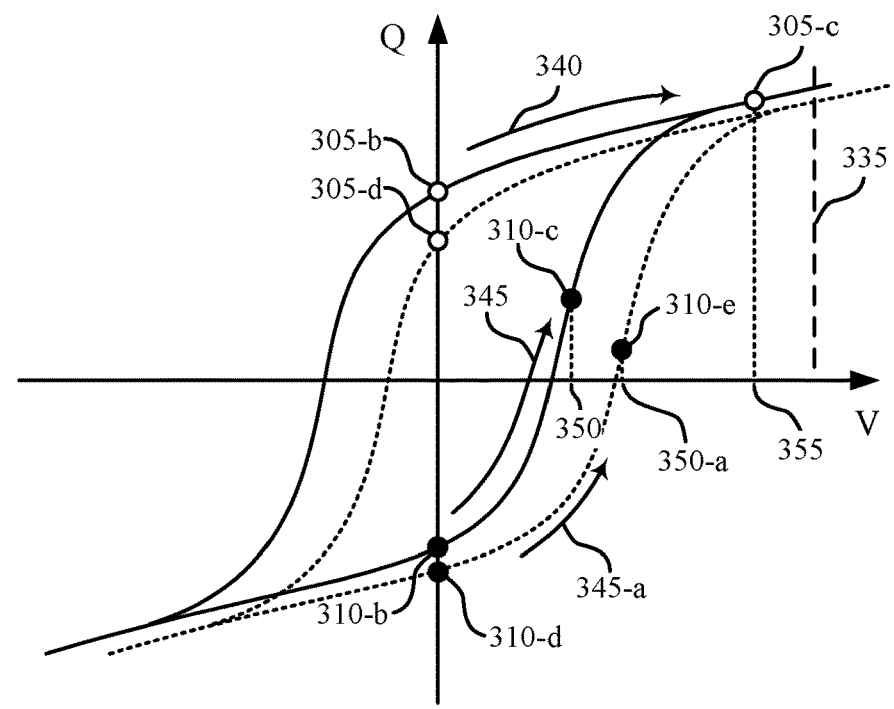

FIG. 3 illustrates examples of non-linear electrical properties with hysteresis curves 300-a and 300-b for a ferroelectric memory cell that is recovered using cycling techniques in accordance with various embodiments of the present disclosure. Hysteresis curves 300-a and 300-b illustrate an example ferroelectric memory cell writing and reading process, respectively. Hysteresis curves 300 depict the charge, Q, stored on a ferroelectric capacitor (e.g., capacitor 205 of FIG. 2) as a function of a voltage difference, V.

A ferroelectric material is characterized by a spontaneous electric polarization, i.e., it maintains a non-zero electric polarization in the absence of an electric field. Example ferroelectric materials include barium titanate ($BaTiO_3$), lead titanate ($PbTiO_3$), lead zirconium titanate (PZT), and strontium bismuth tantalate (SBT). The ferroelectric capacitors described herein may include these or other ferroelectric materials. Electric polarization within a ferroelectric capacitor results in a net charge at the ferroelectric material's surface and attracts opposite charge through the capacitor terminals. Thus, charge is stored at the interface of the ferroelectric material and the capacitor terminals. Because the electric polarization may be maintained in the absence of an externally applied electric field for relatively long times, even indefinitely, charge leakage may be significantly decreased as compared with, for example, capacitors employed in DRAM arrays. This may reduce the need to perform refresh operations as described above for some DRAM architectures.

Hysteresis curves 300 may be understood from the perspective of a single terminal of a capacitor. By way of example, if the ferroelectric material has a negative polarization, positive charge accumulates at the terminal. Likewise, if the ferroelectric material has a positive polarization, negative charge accumulates at the terminal. Additionally, it should be understood that the voltages in hysteresis curves 300 represent a voltage difference across the capacitor and are directional. For example, a positive voltage may be realized by applying a positive voltage to the terminal in question (e.g., a cell plate 230) and maintaining the second terminal (e.g., a cell bottom 215) at ground (or approximately zero volts (0V)). A negative voltage may be applied by maintaining the terminal in question at ground and applying a positive voltage to the second terminal—i.e., positive voltages may be applied to negatively polarize the terminal in question. Similarly, two positive voltages, two negative voltages, or any combination of positive and negative voltages may be applied to the appropriate capacitor terminals to generate the voltage difference shown in hysteresis curves 300.

As depicted in hysteresis curve 300-a, the ferroelectric material may maintain a positive or negative polarization with a zero voltage difference, resulting in two possible charged states: charge state 305 and charge state 310. According to the example of FIG. 3, charge state 305 represents a logic 0 and charge state 310 represents a logic 1. In some examples, the logic values of the respective charge states may be reversed to accommodate other schemes for operating a memory cell.

A logic 0 or 1 may be written to the memory cell by controlling the electric polarization of the ferroelectric material, and thus the charge on the capacitor terminals, by applying voltage. For example, applying a net positive voltage 315 across the capacitor results in charge accumulation until charge state 305-a is reached. Upon removing voltage 315, charge state 305-a follows path 320 until it reaches charge state 305 at zero voltage potential. Similarly, charge state 310 is written by applying a net negative voltage 325, which results in charge state 310-a. After removing negative voltage 325, charge state 310-a follows path 330 until it reaches charge state 310 at zero voltage. Charge states 305-a and 310-a may also be referred to as the remnant polarization values, i.e., the polarization (or charge) that remains upon removing the external bias (e.g., voltage). The coercive voltage is the voltage at which the charge (or polarization) is zero.

To read, or sense, the stored state of the ferroelectric capacitor, a voltage may be applied to the capacitor. In response, the stored charge, Q, changes and the degree of the change depends on the initial charge state—i.e., the final stored charge (Q) may depend on whether charge state 305-b or 310-b was initially stored. For example, hysteresis curve 300-b illustrates two possible stored charge states 305-b and 310-b. Voltage 335 may be applied to a capacitor cell plate—e.g., cell plate 230 with reference to FIG. 2. Although depicted as a positive voltage, voltage 335 may be negative. In response to voltage 335, charge state 305-b may follow path 340. Likewise, if charge state 310-b was initially stored, then it follows path 345. The final position of charge state 305-c and charge state 310-c depend on a number of factors, including the specific sensing scheme and circuitry.

In some cases, the final charge may depend on the intrinsic capacitance of the digit line connected to the memory cell. For example, if the capacitor is electrically connected to the digit line and voltage 335 is applied, the voltage of the digit line may rise due to its intrinsic capacitance. So a voltage measured at a sense component may not equal voltage 335 and instead may depend on the voltage of the digit line. The position of final charge states 305-c and 310-c on hysteresis curve 300-b may thus depend on the capacitance of the digit line and may be determined through a load-line analysis—i.e., charge states 305-c and 310-c may be defined with respect to the digit line capacitance. As a result, the voltage of the capacitor, voltage 350 or voltage 355, may be different and may depend on the initial state of the capacitor.

By comparing the digit line voltage to a reference voltage, the initial state of the capacitor may be determined. The digit line voltage may be the difference between voltage 335 and the final voltage across the capacitor, voltage 350 or voltage 355—i.e., (voltage 335-voltage 350) or (voltage 335-voltage 355). A reference voltage may be generated so that its magnitude is between the two possible digit line voltages in order to determine the stored logic state—i.e., to determine whether the digit line voltage is higher or lower than the reference voltage. For example, the reference voltage may be an average of the two quantities, (voltage 335-voltage 350) and (voltage 335-voltage 355). Upon comparison by the sense component, the sensed digit line voltage may be determined to be higher or lower than the reference voltage, and the stored logic value of the ferroelectric memory cell (i.e., a logic 0 or 1) may be determined.

As discussed above, reading a memory cell that does not use a ferroelectric capacitor may degrade or destroy the stored logic state. A ferroelectric memory cell, however, may maintain the initial logic state after a read operation. For example, if charge state 310-b is stored, the charge state may follow path 345 to charge state 310-c during a read operation and, after removing voltage 350, the charge state may return to initial charge state 310-b by following path 345 in the opposite direction. In some cases, reading a ferroelectric memory cell is destructive, and after reading the cell, a write-back procedure may be performed. In such cases, the write-back procedure may involve application of a voltage to restore the charge of the cell to its initial charge state 310-b.

A fatigued ferroelectric capacitor may follow an alternative path 345-a. The alternative path 345-a may be associated with a charge state 310-e, which is less than charge state 310-c, and a voltage 350-a across the capacitor, which is greater than 350. Therefore, the resulting voltage of the digit line (voltage 335-voltage 350-a) may be smaller than the voltage of the digit line 115 associated with voltage 350. Additionally, the remnant polarization (e.g., as measured between charge state 305-d and charge state 310-d) may decrease with fatigue. As a result, the difference between the resulting voltage of the digit line, (voltage 335-voltage 350-a) and (voltage 335-voltage 355), may also be smaller, which may yield a smaller sensing window and increased number of read errors. Applying a series of pulses to the capacitor at an increased rate, as described herein, may be used to restore at least a portion of the original charge states 305-b and 310-b and, and may thus increase the sensing window.

Figure 4:
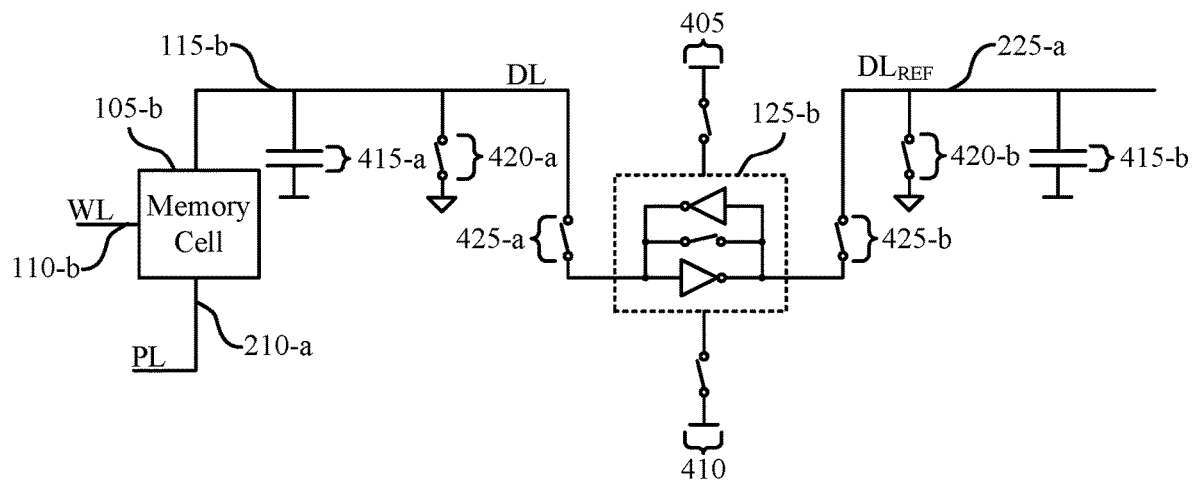
FIG. 4 illustrates an example circuit that supports recovery of a ferroelectric memory cell using cycling techniques in accordance with various embodiments of the present disclosure.

FIG. 4 illustrates an example circuit 400 that supports recovery of a memory cell using cycling techniques in accordance with various embodiments of the present disclosure. Circuit 400 includes memory cell 105-b, word line 110-b (which may also be referred to as an access line), digit line 115-b, and sense component 125-b, which may be examples of a memory cell 105, word line 110, digit line 115, and sense component 125, respectively, described with reference to FIGS. 1 and 2. Circuit 400 also includes plate line 210-a and reference line 225-a, which may be examples of plate line 210 and reference line 225, respectively, described with reference to FIG. 2. Circuit 400 also includes voltage source 405, voltage source 410, equalization switches 420-a and 420-b, and isolation components 425-a and 425-b. Equalization switches 420 and isolation components 425 may also be generally referred to as switching components.

Digit line 115-b and reference line 225-a may have intrinsic capacitances 415-a and 415-b, respectively. Intrinsic capacitances 415-a and 415-b may not be electrical devices—i.e., may not be two-terminal capacitors. Instead, intrinsic capacitances 415-a and 415-b may depend on physical characteristics, including the dimensions, of digit line 115-b and reference line 225-a. In some cases, reference line 225-a is an unused or inactive digit line. In some examples, digit line 115-b and reference line 225-a may be connected to or separated from virtual ground through equalization switches 420-a and 420-b. A virtual ground may act as a common reference for circuit 400 and may also be referred to as ground or 0V, although, the virtual ground may float to a voltage that is different than (e.g., greater or less than) zero volts when compared with an earth ground.

In one example, control signals (e.g., a linear equalization signal) may be used to activate or deactivate equalization switches 420-a or 420-b by increasing or decreasing a linear equalization voltage applied to the switching component, respectively. In some cases, equalization switch 420-a may be used to prevent the voltage of digit line 115-b from floating while digit line 115-b is not being used. Equalization switches 420-a and 420-b and isolation component 425-a and 425-b may be implemented as transistors (e.g., field effect transistors (FETs)).

A voltage may be applied to reference line 225-a to provide a reference for comparing with the voltage of digit line 115-b. The voltage of reference line 225-a may be used by sense component 125-b as a reference for comparison against the voltage of digit line 115-b. As depicted, ferroelectric memory cell 105-b is in electronic communication with digit line 115-b. Ferroelectric memory cell 105-b may include a selection component in electronic communication with a ferroelectric capacitor via word line 110-b, as described with reference to FIG. 2. The selection component may be activated by applying a voltage to word line 110-b and may be used to provide a conductive path between the ferroelectric capacitor and the digit line 115-b. In one example, ferroelectric memory cell 105-b may be selected, using the selection component, for a read operation to determine a state stored by the ferroelectric capacitor.

Plate line 210-a may also be in electronic communication with the ferroelectric capacitor. In some cases, a plate of the ferroelectric capacitor may be biased via plate line 210-a (e.g., for a read operation). Applying a non-zero voltage across the capacitor in combination with applying a voltage to word line 110-b may result in the ferroelectric capacitor charging digit line 115-b. That is, upon accessing ferroelectric memory cell 105-b, the ferroelectric capacitor may share charge with digit line 115-b via intrinsic capacitance 415-a. In some examples, the digit line 115-b may be driven to a ground reference or a supply voltage, and a voltage may be applied at plate line 210-a to apply a voltage across the ferroelectric capacitor; the voltage applied to plate line 210-a may be ramped from a first to a second voltage. In some examples, a constant voltage may be applied to plate line 210-a and the voltage of digit line 115-b may be driven to a virtual ground or a supply voltage to apply a voltage across the ferroelectric capacitor.

Isolation component 425-a may be in electronic communication with sense component 125-b and digit line 115-b, and isolation component 425-b may be in electronic communication with sense component 125-b and reference line 225-a. Isolation components 425-a and 425-b may be used to isolate digit line 115-b and reference line 225-a from sense component 125-b. Sense component 125-b may be used to determine the stored state of ferroelectric memory cell 105-b. In some cases, sense component 125-b is or includes a sense amplifier. Sense component 125-b may be operated by voltage source 405 and voltage source 410. In some examples, voltage source 405 is a positive supply voltage, while voltage source 410 is a negative supply voltage or a virtual ground. Sense component 125-b may be activated or deactivated by a controller.

For example, sense component 125-b may be used to determine a logic value of the ferroelectric memory cell 105-b based on the voltage of digit line 115-b and the voltage of the reference line 225-a. In some examples, sense component 125-b is activated or "fired" to trigger a comparison between the voltage of digit line 115-b and the voltage of reference line 225-a. Sense component 125-b may latch the output of a sense amplifier to the voltage provided by either voltage source 405 or voltage source 410. For instance, if the voltage of the digit line 115-b is greater than the voltage of the reference line 225-a, then sense component 125-b may latch the output of the sense amplifier at a positive voltage supplied from voltage source 405.

Sense component 125-b may also be used to write a logic value to ferroelectric memory cell 105-b. For instance, during a write operation, sense component 125-b may be triggered to apply a voltage that is greater than a voltage applied at plate line 210-a to write a logic state 1 to ferroelectric memory cell 105-b. In some examples, the voltage applied by sense component 125-b may be dependent on voltage source 405 and 410. For instance, voltage source 405 may provide the voltage that is greater than the voltage applied at plate line 210-a.

In some examples, a controller may be used to operate circuit 400 to support cycling of memory cell 105-b. For instance, the controller may be used to trigger sense component 125-b to perform a sensing operation or to apply a voltage to digit line 115-b and/or reference line 225-a. The controller may also be used to activate/deactivate equalization switches 420 and isolation components 425 and to select memory cell 105-b via word line 110-b. In some examples, the controller may be used to access memory cell 105-b using word line 110-b and to read/write to memory cell 105-b using plate line 210-a and digit line 115-b. The controller may include one or more components (e.g., a timing component) to determine an average rate of access for memory cell 105-b. The timing component may additionally be used to determine when memory cell 105-b has reached a state of fatigue—e.g., based on the access rate and an elapsed amount of time. Additionally or alternatively, the controller may include a component (e.g., a counter) may be used to determine a number of access operations performed on memory cell 105-b and may use the average rate of access and the number of access operations to identify the state of fatigue. After identifying the state of fatigue, the controller may use the word line 110-b, plate line 210-a, digit line 115-b, and/or sense component 125-b to apply a series of pulses to memory cell 105-b to recover the remnant polarization of memory cell 105-b.

Figure 5:
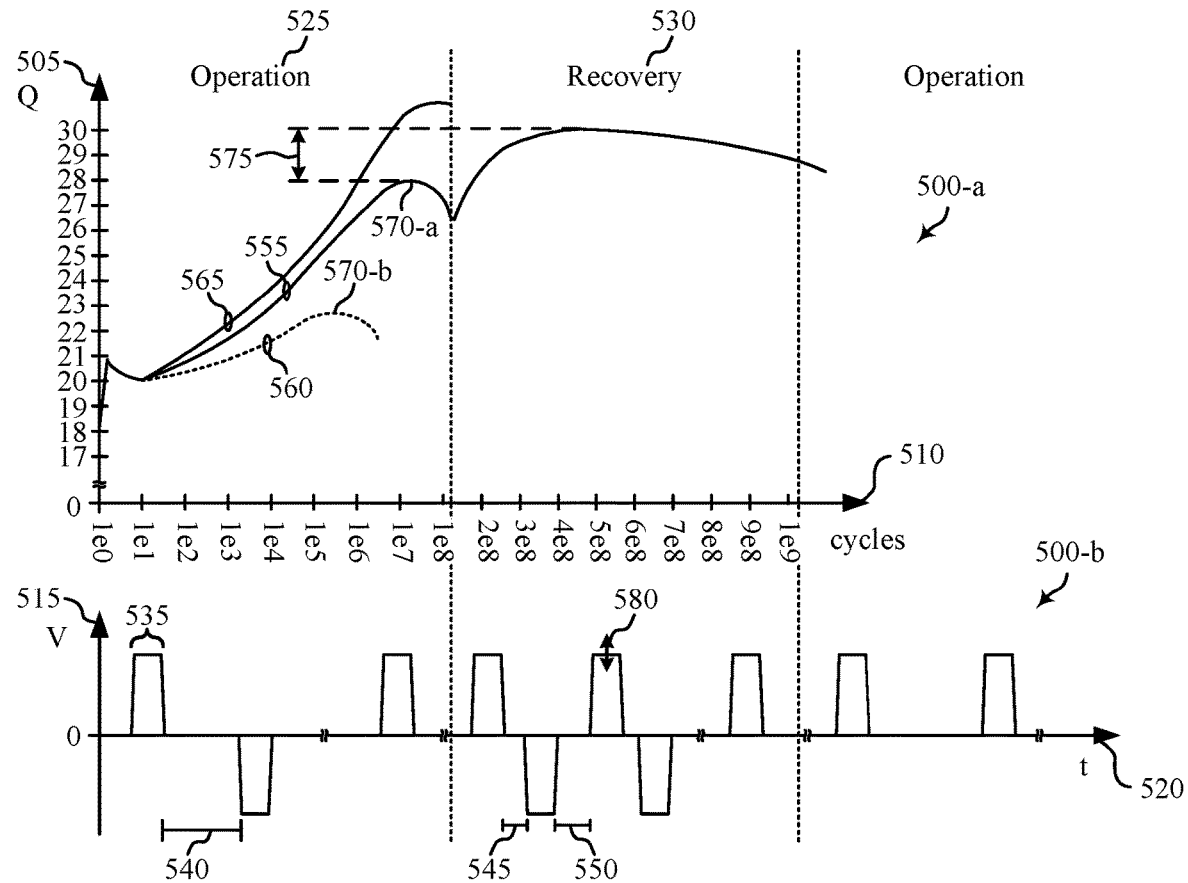
FIG. 5 illustrates an example diagram of cycling a ferroelectric memory cell in accordance with various embodiments of the present disclosure.

FIG. 5 illustrates example timing diagram 500-b and example operating diagram 500-a of cycling a ferroelectric memory cell in accordance with various embodiments of the present disclosure. Operating diagram 500-a depicts charge on axis 505 and a number of performed cycles on axis 510. The charge stored by a memory cell as a function of the number of access operations (or cycles) performed on the memory cell may thus be represented on operating diagram 500-a. Timing diagram 500-b depicts voltage on axis 515 and time on axis 520. The voltage applied across a memory cell as a function of time may thus be represented on timing diagram 500-b.

As discussed with reference to FIG. 4, memory cell 105-b may be accessed for read and/or write operations during operation of a memory array that includes memory cell 105-b. Accessing memory cell 105-b may include a pulse 535 that corresponds to a voltage being applied across a ferroelectric capacitor of memory cell 105-b. Pulse 535 may be indicative of an access operation and may be represented as a step function and may include a rising edge, a plateau, and a falling edge. In some examples, the rising edge, the plateau, and the falling edge may each span approximately 50 ns. After the access operation, a delay 540 may elapse prior to a following access operation. This delay 540 may vary in magnitude from access operation to access operation and from memory cell to memory cell. For instance, the magnitude may vary from tens of nanoseconds (ns) to tens of milliseconds (ms) based on a function of the memory cell or a function of a device that includes a memory cell. For example, a memory cell may be included in a sensing device that is accessed at set intervals or may be used in memory applications which may be accessed infrequently. In some instances, a memory cell may be used for an operating function that is associated with an average delay 540 between access operations (e.g., 10 microseconds (µs), 1 ms, etc.).

The operation of the memory cell 105-*b* may be influenced by the rate at which it is accessed. For instance, if memory cell 105-*b* is accessed at a higher rate the operating curve 565 may be observed, whereas if memory cell 105-*b* is accessed at a lower rate the operating curve 560 may be observed. Operating curve 555 may correspond to memory cell 105-*b* being accessed at a rate between the higher rate and the lower rate. A fatigue state for operating curves 555 and 560 may be indicated by peaks 570-*a* and 570-*b*. As operating diagram 500-*a* shows, during operation period 525 a memory cell accessed at a lower rate (e.g., a memory cell that follows operating curve 560) may experience the effects of fatigue after fewer access operations than that of a memory cell accessed at a higher rate. In the example of FIGS. 4 and 5, memory cell 105-*b* may be accessed using an access rate that is associated with an average delay 540 of 10 µs between access operations and may follow operating curve 555. In the example of FIG. 5, memory cell 105-*b* may reach a state of fatigue at a point between $1\times10^7$ and $1\times10^8$ access operations. As depicted in FIG. 5, a number of cycles is noted on axis 510 using e-notation, in which "1eX" represents "$1\times10^X$," a notation understood by those skilled in the art. This type of notation is also used elsewhere herein.

After identifying memory cell 105-*b* has entered a fatigue state, a recovery period 530 for memory cell 105-*b* may begin. During recovery period 530, a series of pulses 535 may be applied to generate a voltage across memory cell 105-*b*. The voltage across the memory cell 105-*b* generated by the series of pulses 535 may alternate in polarity and be separated in time by delay 545 or 550. In some examples, delays 545 and 550 may be shorter (e.g., approximately 50 ns) than the delay 540 associated with operation of the memory cell 105-*b* and may extend for the same duration. In other examples, delays 545 and 550 may be of different durations. In some cases, the series of pulses 535 may not alternate in polarity, but may all have the same polarity. In other cases, the series of pulses 535 may not alternate in polarity, but may include a first set of pulses 535 with a first polarity that is followed by a second set of pulses with a second polarity that is different than the first polarity. The series of pulses 535 applied during the recovery period 530 may restore the remnant polarization of memory cell 105-*b* to or greater than pre-fatigue levels as indicated by interval 575.

In some cases, the number of pulses applied during recovery period 530 to recover the stored charge is based on the number of access operation performed during operation period 525. For instance, in FIG. 5 the number of access operations that occur during operation period 525 may be approximately 1e8 and the number of pulses applied to recover the greatest amount of stored charge may be approximately 3e8. This may similarly apply to different operating curves, for instance for operating curve 560 the recovery period 530 may begin after approximately 1e6 access operations and may include approximately 1e6 pulses (e.g., an integer multiple, a fractional value, etc.) during the recovery period 530. Although FIG. 5 depicts recovery period 530 including 1e9 cycles, in some operation the recovery period may be terminated after achieving the greatest amount of recovered charge for a memory cell (e.g., approximately 3e8 pulses). Or recovery period may be terminated after achieving less than the greatest amount of recovered charge (e.g., 5e7 pulses, 1e8 pulses, etc.)

In some examples, the recovery period 530 may be short in duration relative to operation period 525. For instance, an operation period 525 associated with an average delay 540 of 10 µs and 1e8 cycles may last around 16 minutes and the recovery period 530 associated with average delays 545 and 550 of 50 ns and 3e8 cycles may last around 45 seconds. A recovery period 530 that does not achieve the greatest amount of recovered charge may be even shorter; for instance. a recovery period 530 with 1e8 cycles may last around 15 seconds. Accordingly, the recovery period 530 may be significantly shorter than the operation period 525 and may have limited effect on the performance of the memory array. Furthermore, in some operations the recovery period may be initialized sooner than shown in FIG. 5, for instance a small number of cycles (e.g., 100 cycles) after the identified peak 570-*a*.

In some cases, the duration between pulses 535 applied during recovery period 530 and the magnitude 580 of the pulses 535 may be modified, for instance based on characteristics of the access operations performed during operation period 525. In one example, delay 545 and delay 550 may be of different durations to compensate for access operations that favor certain access operations over others—e.g., a memory cell that is written with more is than Os. In some cases, the average delay of delay 545 and 550 may remain less than delay 540. At the end of recovery period 530, memory cell 105-*b* may transition back into its previous (e.g., normal) state of operation. In some cases, the magnitude 580 of the pulses 535 may be increased to a level that is greater than a magnitude used for the pulses 535 applied during operation period 525. In this way, the sensing window for memory cell 105-*b* may be maintained at a desired level, and as a result the operating life of the memory cell 105-*b* may also be extended.

In some examples, the recovery period 530 may be triggered at varying times or for reasons other than identifying a peak 570 corresponding to a fatigue state. For instance, the recovery period 530 may be triggered externally (e.g., by a user), periodically (e.g., at set intervals), or internally (e.g., in the background). In some cases, the recovery period 530 for memory cell 105-*b* may be triggered while sections of a memory array not including memory cell 105-*b* are accessed or based on identifying that a section including memory cell 105-*b* is due to be accessed. In some cases, the triggering for recovery period 530 may be based on the actual usage of a section (e.g., using an internal/external counter). In other cases, recovery period 530 may be triggered based on an the occurrence of certain events (e.g., when a device is connected to a power supply). In some examples, recovery period 530 may be triggered as a result of an error correcting code (ECC) array detecting a number of access errors (e.g., read or write errors) that exceeds a threshold value. In some cases, a state stored by memory cell 105-*b* may be stored (e.g., cached) in a different memory cell prior to initiating recovery period 530 for memory cell 105-*b*. For instance, if memory cell 105-*b* is used for storage and the stored state needs to be retained, the state stored in memory cell 105-*b* may be stored in another memory cell, such as an additional ferroelectric memory cell. In some cases, the additional ferroelectric memory cell may be used for either volatile or non-volatile memory. In other cases, no action may be taken to preserve the state stored by memory cell 105-*b* prior to initiating recovery period 530. For instance, if memory cell 105-*b* is used for short-term memory (e.g., RAM), and the logic state stored in memory cell 105-*b* is no longer needed.

Figure 6:
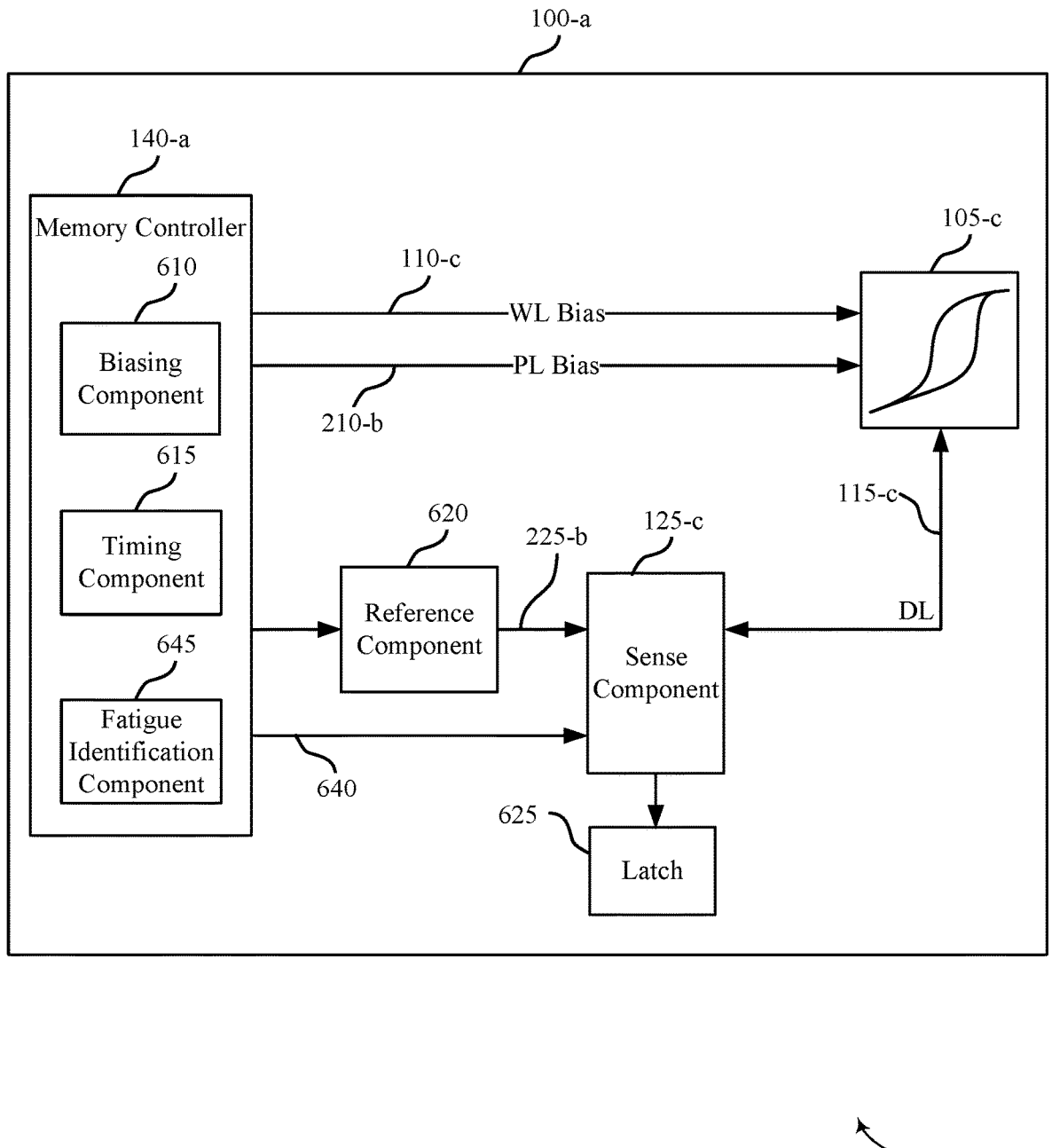
FIG. 6 illustrates a block diagram of an example ferroelectric memory array that supports recovery of a memory cell using cycling techniques in accordance with various embodiments of the present disclosure.

FIG. 6 shows a block diagram 600 of a memory array 100-*a* that supports recovery of a ferroelectric memory cell using cycling techniques in accordance with various embodiments of the present disclosure. Memory array 100-*a* may be referred to as an electronic memory apparatus and includes memory controller 140-*a*, and a memory cell 105-*c*, which may be examples of memory controller 140 and a memory cell 105 as described with reference to FIGS. 1, 2, and 4. Memory controller 140-*a* may include biasing component 610, timing component 615, and fatigue identification component 645 and may operate memory array 100-*a* as described in FIGS. 1-5.

Memory controller 140-*a* may be in electronic communication with word line 110-*c*, digit line 115-*c*, sense component 125-*c*, and plate line 210-*b*, which may be examples of word line 110, digit line 115, sense component 125, and plate line 210 described with reference to FIGS. 1, 2, and 4. Memory array 100-*a* may also include reference component 620 and latch 625. The components of memory array 100-*a* may be in electronic communication with each other and may perform the functions described with reference to FIGS. 1-5. In some cases, reference component 620, sense component 125-*c*, and latch 625 may be components of memory controller 140-*a*.

In some examples, digit line 115-*c* is in electronic communication with sense component 125-*c* and a ferroelectric capacitor of ferroelectric memory cell 105-*c*. Word line 110-*c* may be in electronic communication with memory controller 140-*a* and a selection component of ferroelectric memory cell 105-*c*. Plate line 210-*a* may be in electronic communication with memory controller 140-*a* and a plate of the ferroelectric capacitor of ferroelectric memory cell 105-*c*. Sense component 125-*c* may be in electronic communication with memory controller 140-*a*, reference line 225-*b*, digit line 115-*c*, and latch 625. Reference component 620 may be in electronic communication with memory controller 140-*a* and reference line 225-*b*. Sense control line 640 may be in electronic communication with sense component 125-*c* and memory controller 140-*a*. These components may also be in electronic communication with other components, both inside and outside of memory array 100-*a*, not listed above, via other components, connections, or busses.

Memory controller 140-*a* may be configured to activate word line 110-*c*, plate line 210-*b*, or digit line 115-*c* by applying voltages to those various nodes. For example, biasing component 610 may be configured to apply a voltage to operate memory cell 105-*c* to read or write memory cell 105-*c* as described above. In some cases, memory controller 140-*a* may include a row decoder, column decoder, or both, as described with reference to FIG. 1. This may enable memory controller 140-*a* to access one or more memory cells 105. Biasing component 610 may also provide voltage potentials to reference component 620 in order to generate a reference signal for sense component 125-*c*. Additionally, biasing component 610 may provide voltage potentials for the operation of sense component 125-*c*.

In some cases, memory controller 140-*a* may perform its operations using timing component 615. For example, timing component 615 may control the timing of the various word line selections or plate biasing, including timing for switching and voltage application to perform the memory functions, such as reading and writing, discussed herein. In some cases, timing component 615 may control the operations of biasing component 610. Reference component 620 may include various components to generate a reference signal for sense component 125-*c*. Reference component 620 may include circuitry configured to produce a reference signal. In some cases, reference component 620 may be implemented using other ferroelectric memory cells 105. Sense component 125-*c* may compare a signal from memory cell 105-*c* (through digit line 115-*c*) with a reference signal from reference component 620. Upon determining the logic state, the sense component may then store the output in latch 625, where it may be used in accordance with the operations of an electronic device that memory array 100-*a* is a part.

Fatigue identification component 645 may be used to determine a fatigue state of ferroelectric memory cell 105-*c*. For instance, fatigue identification component 645 may identify a fatigue state based on a number of observed access operations performed on ferroelectric memory cell 105-*c*, an average delay between access operations performed on ferroelectric memory cell 105-*c*, a fatigue model for ferroelectric memory cell 105-*c* that predicts a number of performed access operations that correspond to a fatigue state of ferroelectric memory cell 105-*c*, etc. In one example, fatigue identification component 645 calculates a duration that corresponds to when the ferroelectric memory cell 105-*c* will reach a fatigue state by multiplying the average delay between access operations with the predicted number of access operations that corresponds to the fatigue state. Timing component 615 may be used in combination with fatigue identification component 645 to determine when the estimated fatigue state will occur. In some cases, fatigue identification component 645 may identify a fatigue state by identifying a peak in the charge stored by ferroelectric memory cell 105-*c*.

In some examples, memory controller 140-*a* may be operated to control the components of memory array 100-*a* to implement the recovery of a memory cell, such as ferroelectric memory cell 105-*c*, using cycling techniques. For instance, biasing component 610 may be used to apply voltages to word line 110-*c* and/or plate line 210-*b* in performing a plurality of access operations on ferroelectric memory cell 105-*c*. The plurality of access operations may be associated with a first delay that can be based on factors such as the operating function of memory cell 105-*c*. In some cases, the first delay may the average delay between access operations performed on memory cell 105-*c*. Fatigue identification component 645 may be used to identify the occurrence of a fatigue state of ferroelectric memory cell 105-*c*, and a combination of timing component 615 and biasing component 610 may be used to apply a series of pulses to the ferroelectric memory cell 105-*c* based on the fatigue identification component 645 identifying the fatigue state. The delay between pulses of the series of applied pulses may be less than the first delay and may increase the amount of charge stored by ferroelectric memory cell 105-*c* to or near pre-fatigue levels.

In some examples, fatigue identification component 645 keeps track of the number of access operations performed on ferroelectric memory cell 105-*c* and triggers biasing component 610 and timing component 615 to apply the series of pulses after a predetermined number of access operations has been performed. The number of pulses included in the series of pulses may be based on the number of performed access operation (e.g., equal to, an integer multiple of, within a 5-10% percent range, etc.). In some examples, the biasing component 610 may be used to apply the series of pulses to generate voltage of alternating polarity across a ferroelectric capacitor of the ferroelectric memory cell 105-c from pulse to pulse. Memory controller 140-a may thus apply voltages of alternating polarity across a ferroelectric capacitor of the ferroelectric memory cell 105-c with each pulse of a plurality of pulses.

In some examples, timing component 615 may be used to control the duration between pulses of the series of pulses. In one instance, timing component 615 may introduce a third delay between a first pulse associated with a first polarity (e.g., a positive polarity) and a second pulse associated with a second polarity (e.g., a negative polarity and may introduce a fourth delay between the second pulse and a third pulse of the first polarity. The third delay and the fourth delay may be of different durations. Biasing component 610 may also be used to vary the voltage magnitude (e.g., increase/decrease) of pulses of the series of pulses. For instance, biasing component 610 may increase the voltage magnitude of one or more pulses of the series of pulses so that the voltage of the one or more pulses is greater than a voltage produced by the biasing component 610 during access operations performed on memory cell 105-c. After applying the series of pulses, memory controller 140-a may return to normal operation during additional access operation are performed on the ferroelectric memory cell 105-c.

Figure 7:
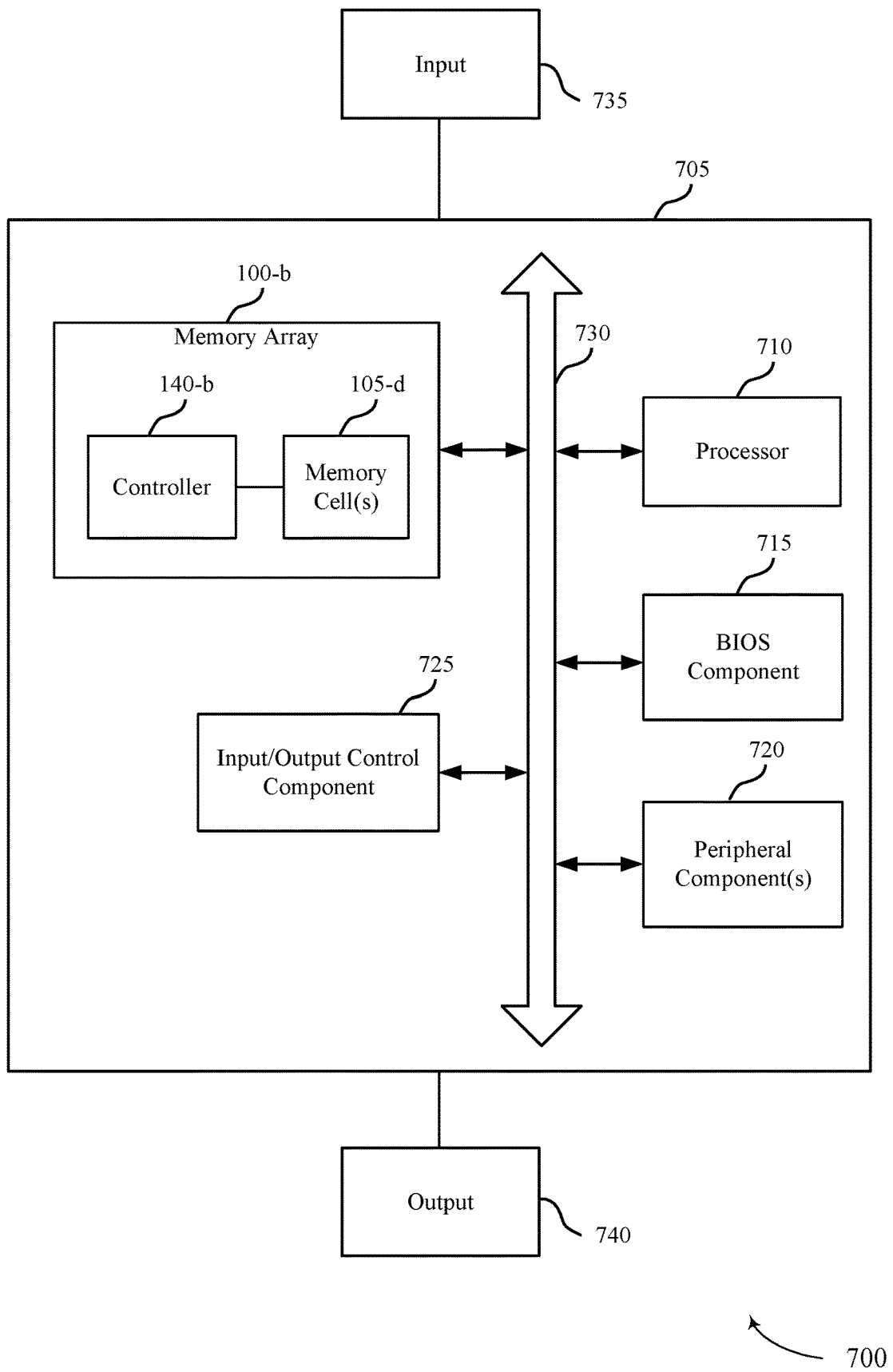
FIG. 7 illustrates a system, including a memory array, that supports recovery of a memory cell using cycling techniques in accordance with various embodiments of the present disclosure.

FIG. 7 illustrates a system 700 that supports recovery of a memory cell using cycling techniques in accordance with various embodiments of the present disclosure. System 700 includes a device 705, which may be or include a printed circuit board to connect or physically support various components. Device 705 includes a memory array 100-b, which may be an example of memory array 100 described with reference to FIG. 1 and FIG. 6. Memory array 100-b may contain memory controller 140-b and memory cell(s) 105-d, which may be examples of memory controller 140 described with reference to FIGS. 1 and 6 and memory cells 105 described with reference to FIGS. 1, 2, 4, and 6. Device 705 may also include a processor 710, BIOS component 715, peripheral component(s) 720, and input/output control component 725. The components of device 705 may be in electronic communication with one another through bus 730.

Processor 710 may be configured to operate memory array 100-b through memory controller 140-b. In some cases, processor 710 may perform the functions of memory controller 140 described with reference to FIGS. 1 and 6. In other cases, memory controller 140-b may be integrated into processor 710. Processor 710 may be a general-purpose processor, a digital signal processor (DSP), an application-specific integrated circuit (ASIC), a field-programmable gate array (FPGA) or other programmable logic device, discrete gate or transistor logic, discrete hardware components, or it may be a combination of these types of components, and processor 710 may perform various functions described herein, including recovery of a memory cell using cycling techniques. Processor 710 may, for example, be configured to execute computer-readable instructions stored in memory array 100-b to cause device 705 perform various functions or tasks.

BIOS component 715 may be a software component that includes a basic input/output system (BIOS) operated as firmware, which may initialize and run various hardware components of system 700. BIOS component 715 may also manage data flow between processor 710 and the various components, e.g., peripheral components 720, input/output control component 725, etc. BIOS component 715 may include a program or software stored in read-only memory (ROM), flash memory, or any other non-volatile memory.

Peripheral component(s) 720 may be any input or output device, or an interface for such devices, that is integrated into device 705. Examples may include disk controllers, sound controller, graphics controller, Ethernet controller, modem, universal serial bus (USB) controller, a serial or parallel port, or peripheral card slots, such as peripheral component interconnect (PCI) or accelerated graphics port (AGP) slots.

Input/output control component 725 may manage data communication between processor 710 and peripheral component(s) 720, input 735 devices, or output 740 devices. Input/output control component 725 may also manage peripherals not integrated into device 705. In some cases, input/output control component 725 may represent a physical connection or port to the external peripheral.

Input 735 may represent a device or signal external to device 705 that provides input to device 705 or its components. This may include a user interface or interface with or between other devices. In some cases, input 735 may be a peripheral that interfaces with device 705 via peripheral component(s) 720 or may be managed by input/output control component 725.

Output 740 may represent a device or signal external to device 705 configured to receive output from device 705 or any of its components. Examples of output 740 may include a display, audio speakers, a printing device, another processor or printed circuit board, etc. In some cases, output 740 may be a peripheral that interfaces with device 705 via peripheral component(s) 720 or may be managed by input/output control component 725.

The components of memory controller 140-b, device 705, and memory array 100-b may be made up of circuitry designed to carry out their functions. This may include various circuit elements, for example, conductive lines, transistors, capacitors, inductors, resistors, amplifiers, or other active or inactive elements, configured to carry out the functions described herein.

Figure 8:
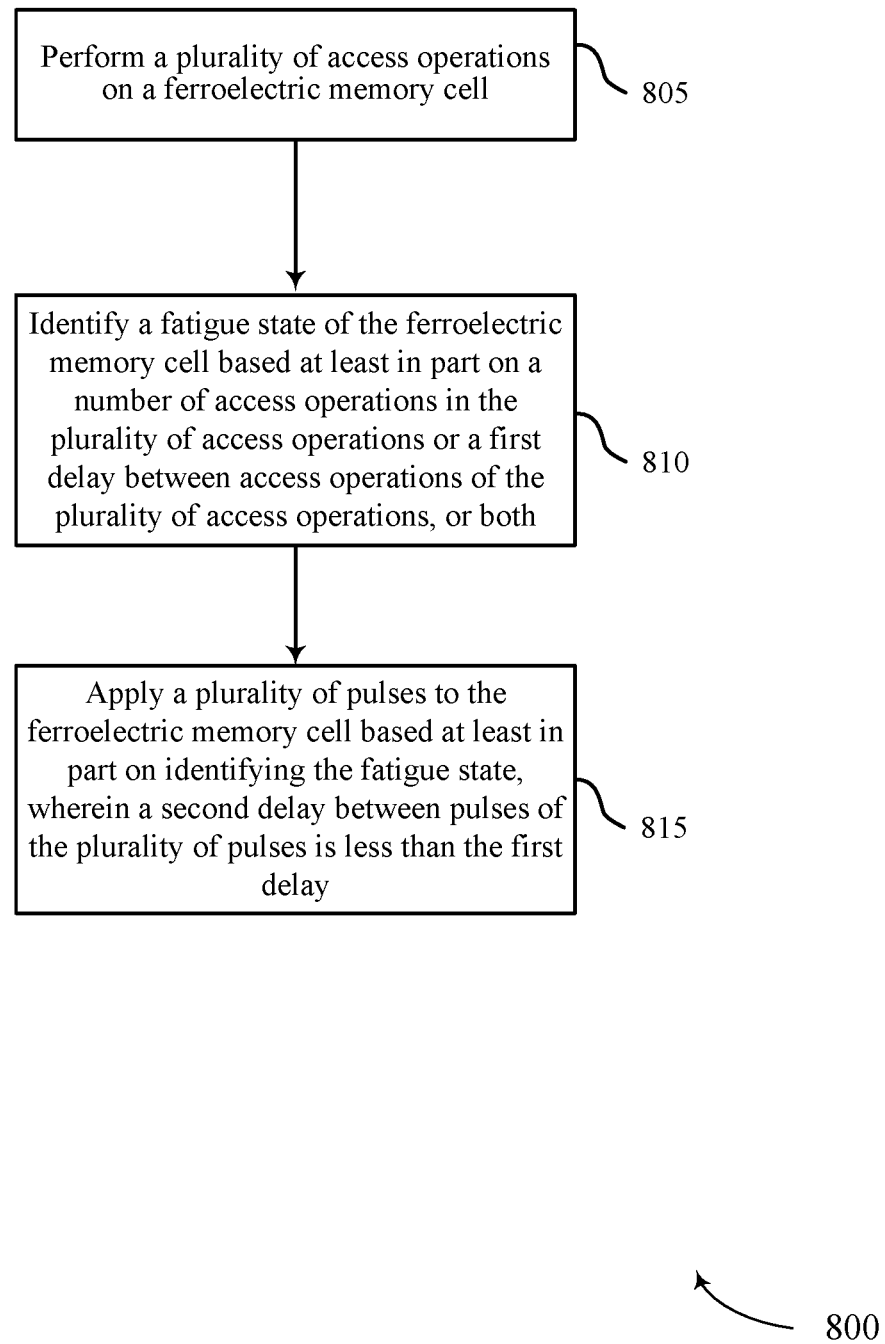
FIGS. 8-9 are flowcharts that illustrate a method or methods for recovery of a memory cell using cycling techniques in accordance with various embodiments of the present disclosure.

FIG. 8 shows a flowchart illustrating a method 800 for recovery of a memory cell using cycling techniques in accordance with various embodiments of the present disclosure.

The operations of method 800 may be implemented by a memory array 100, as described with reference to FIGS. 1-7. For example, the operations of method 800 may be performed by a memory controller 140 as described with reference to FIGS. 1, 6, and 7. In some examples, a memory controller 140 may execute a set of codes to control the functional elements of the memory array 100 to perform the functions described below. Additionally or alternatively, the memory controller 140 may perform features of the functions described below using special-purpose hardware.

At block 805, the method may include performing a plurality of access operations on a ferroelectric memory cell, as described with reference to FIGS. 1-7. In certain examples, the operations of block 805 may be performed or facilitated by the biasing component 610, as described with reference to FIG. 6. A first delay may be associated with a duration or average duration between access operations of the plurality of access operations. In some examples, the first delay is an average duration between access operations for the ferroelectric memory cell.

At block 810, the method may include identifying a fatigue state of the ferroelectric memory cell based on a number of access operations in the plurality of access operations or the first delay between access operations of the plurality of access operations, or both, as described with reference to FIGS. 1-7. In certain examples, the operations of block 810 may be performed or facilitated by the fatigue identification component 645, as described with reference to FIG. 6. In some examples, the method may include storing a logic state of the ferroelectric memory cell in an additional ferroelectric memory cell before applying a plurality of pulses in a cycling recovery procedure.

At block 815, the method may include applying the plurality of pulses to the ferroelectric memory cell based on identifying the fatigue state, wherein a second delay between pulses of the plurality of pulses is less than the first delay, as described with reference to FIGS. 1-7. In certain examples, the operations of block 815 may be performed or facilitated by the timing component 615 and the biasing component 610, as described with reference to FIG. 6. The second delay may be associated with a duration or an average duration between pulses of the plurality of pulses. In some examples of the method, the plurality of pulses is applied after determining the number of access operations has been performed on the ferroelectric memory cell, and a number of pulses included in the plurality of pulses is based on the number of access operations performed on the ferroelectric memory cell.

In some cases, applying the plurality of pulses comprises applying voltages of alternating polarity across a ferroelectric capacitor of the ferroelectric memory cell with each pulse of the plurality of pulses. In some examples, a third delay may include a first duration between a first pulse associated with a first polarity and a second pulse associated with a second polarity, and a fourth delay may include a second duration between the second pulse of the second polarity and a third pulse associated with the first polarity. In some examples, the first duration of the third delay and the second duration of the fourth delay may be different (e.g., less than or greater) or the same durations. In some examples, a magnitude of a voltage of each pulse of the plurality of pulses may be greater than a magnitude of a voltage used for each access operation of the plurality of access operation. The method may also include performing additional access operations on the ferroelectric memory cell after applying the plurality of pulses.

Figure 9:
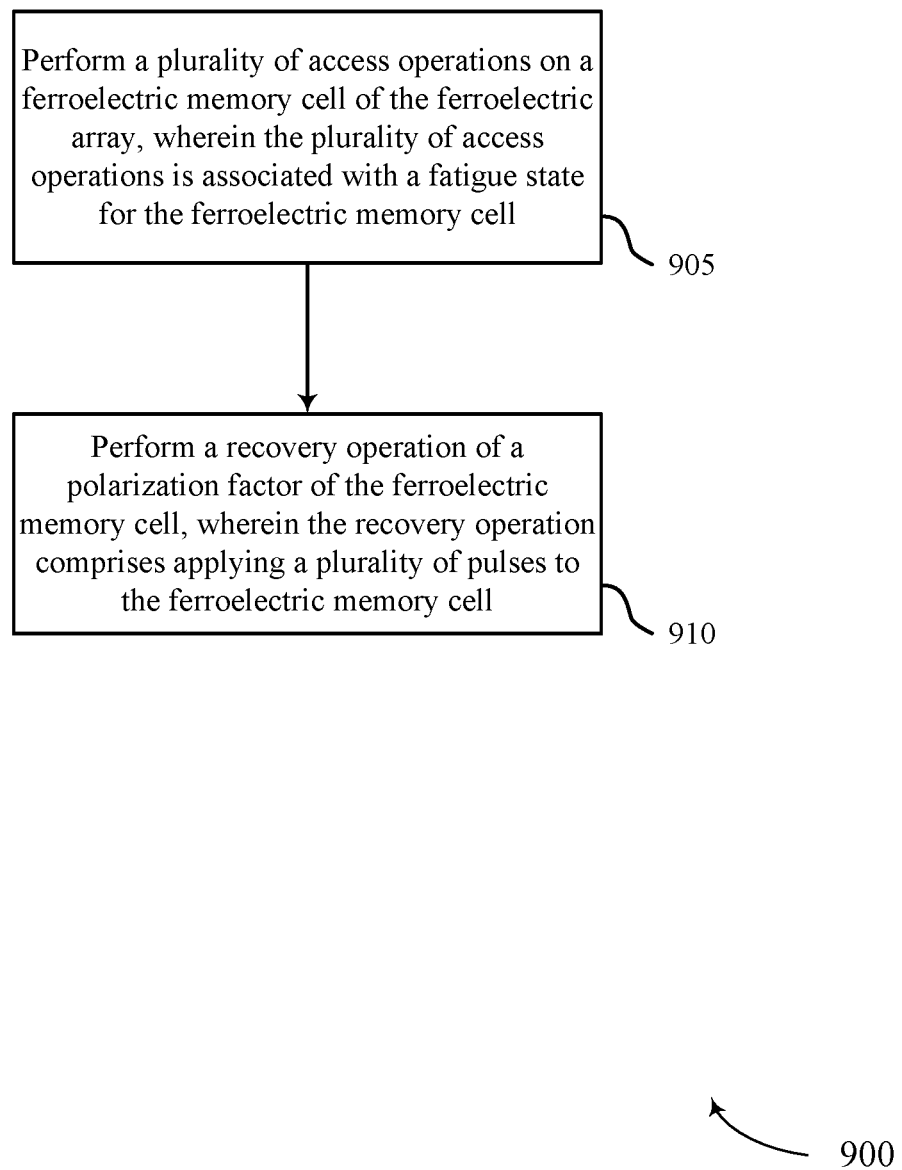

FIG. 9 shows a flowchart illustrating a method 900 for recovery of a memory cell using cycling techniques in accordance with various embodiments of the present disclosure. The operations of method 900 may be implemented by a memory array 100, as described with reference to FIGS. 1-7. For example, the operations of method 900 may be performed by a memory controller 140 as described with reference to FIGS. 1, 6, and 7. In some examples, a memory controller 140 may execute a set of codes to control the functional elements of the memory array 100 to perform the functions described below. Additionally or alternatively, the memory controller 140 may perform features of the functions described below using special-purpose hardware.

At block 905, the method may include performing a plurality of access operations on a ferroelectric memory cell of the ferroelectric array, wherein the plurality of access operations is associated with a fatigue state for the ferroelectric memory cell, as described with reference to FIGS. 1-7. In certain examples, the operations of block 905 may be performed or facilitated by the biasing component 610, as described with reference to FIG. 6.

The fatigue state may be based on a number of access operations in the plurality of access operations or a first delay between access operations of the plurality of access operations, or both. In some examples, the number of access operations corresponding to the fatigue state may be determined based on a model of the ferroelectric memory cell. The first delay may be based on an average duration between access operations. In some examples, determining the average duration may be based on a use of the ferroelectric memory cell. For instance, the ferroelectric memory cell may be used for one of a read-only functionality or a random-access functionality.

The method may also include monitoring a number of performed access operations on the ferroelectric memory cell to identify the fatigue state based on the number of performed access operation and the number of access operations associated with the fatigue state (e.g., via a comparison). In some examples, the method may include calculating a corresponding to fatigue of the ferroelectric memory cell using the first delay and the number of access operations and the fatigue state for the ferroelectric memory cell may be based on the calculated duration.

At block 910, the method may include performing a recovery operation of a polarization factor of the ferroelectric memory cell, wherein the recovery operation comprises applying a plurality of pulses to the ferroelectric memory cell, as described with reference to FIGS. 1-7. In certain examples, the operations of block 910 may be performed or facilitated by the fatigue identification component 645, the timing component 615, and the biasing component 610, as described with reference to FIG. 6. In some cases, the pulses are applied to the ferroelectric memory cell based on identifying a fatigue state of the ferroelectric memory cell. In some examples, performing the recovery operation may be triggered by the occurrence of an event. For instance, a recovery operation may be performed as a result of receiving an input from a user triggering the recovery operation; receiving a periodic signal triggering the recovery operation; determining that an access operation is scheduled for a section of the memory array including the ferroelectric memory cell; identifying the section of the memory array has been accessed a number of times greater than a threshold value; identifying that an external power supply is available to power the memory array; and detecting a number of access-based errors exceeds a threshold value, or any combination thereof.

Thus, methods 800 and 900 may be a method or methods of operating a ferroelectric memory array that provide for recovery of the memory cell using cycling techniques. It should be noted that methods 800 and 900 describe possible implementations, and the operations and steps may be rearranged, omitted, or otherwise modified such that other implementations are possible. In some examples, features from two or more of the methods 800 and 900 may be combined.

The description herein provides examples, and is not limiting of the scope, applicability, or examples set forth in the claims. Changes may be made in the function and arrangement of elements discussed without departing from the scope of the disclosure. Various examples may omit, substitute, or add various procedures or components as appropriate. Also, features described with respect to some examples may be combined in other examples.

The description set forth herein, in connection with the appended drawings, describes example configurations and does not represent all the examples that may be implemented or that are within the scope of the claims. The terms "example," "exemplary," and "embodiment," as used herein, mean "serving as an example, instance, or illustration," and not "preferred" or "advantageous over other examples." The detailed description includes specific details for the purpose of providing an understanding of the described techniques. These techniques, however, may be practiced without these specific details. In some instances, well-known structures and devices are shown in block diagram form in order to avoid obscuring the concepts of the described examples.

In the appended figures, similar components or features may have the same reference label. Further, various components of the same type may be distinguished by following the reference label by a dash and a second label that distinguishes among the similar components. When the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

As used herein, the term "virtual ground" refers to a node of an electrical circuit that is held at a voltage of approximately zero volts (0V) but that is not directly connected with ground. Accordingly, the voltage of a virtual ground may temporarily fluctuate and return to approximately 0V at steady state. A virtual ground may be implemented using various electronic circuit elements, such as a voltage divider consisting of operational amplifiers and resistors. Other implementations are also possible. "Virtual grounding" or "virtually grounded" means connected to approximately 0V.

The term "electronic communication" refers to a relationship between components that supports electron flow between the components. This may include a direct connection between components or may include intermediate components. Components in electronic communication may be actively exchanging electrons or signals (e.g., in an energized circuit) or may not be actively exchanging electrons or signals (e.g., in a de-energized circuit) but may be configured and operable to exchange electrons or signals upon a circuit being energized. By way of example, two components physically connected via a switch (e.g., a transistor) are in electronic communication regardless of the state of the switch (i.e., open or closed).

The term "isolated" refers to a relationship between components in which electrons are not presently capable of flowing between the components; components are isolated from each other if there is an open circuit between them. For example, two components physically connected by a switch may be isolated from each other when the switch is open.

As used herein, the term "shorting" refers to a relationship between components in which a conductive path is established between the components via the activation of a single intermediary component between the two components in question. For example, a first component shorted to a second component may exchange electrons with the second component when a switch between the two components is closed. Thus, shorting may be a dynamic operation that enables the flow of charge between components (or lines) that are in electronic communication.

The devices discussed herein, including memory array 100, may be formed on a semiconductor substrate, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A transistor or transistors discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The various illustrative blocks, components, and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C).

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor.

Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be readily apparent to those skilled in the art, and the generic principles defined herein may be applied to other variations without departing from the scope of the disclosure. Thus, the disclosure is not to be limited to the examples and designs described herein but is to be accorded the broadest scope consistent with the principles and novel features disclosed herein.

What is claimed is:

1. A method, comprising:
applying a plurality of access pulses to a memory cell in an operation state;
calculating a remnant polarization level of the memory cell using the plurality of access pulses and an average delay between access operations, wherein the remnant polarization level corresponds to a reduced amount of charge capable of being retained by the memory cell with respect to a peak charge of the memory cell; and
determining a fatigue state of the memory cell based at least in part on calculating the remnant polarization level of the memory cell.

2. The method of claim 1, wherein the fatigue state of the memory cell corresponds to a change in a polarity of a remnant polarization of the memory cell from a positive polarity to a negative polarity.

3. The method of claim 1,
wherein a first number of the access pulses of the plurality is associated with writing a first logic state,
a second number of the access pulses of the plurality is associated with writing a second logic state, and
the first number of the access pulses is greater than the second number of the access pulses.

4. The method of claim 3, further comprising:
generating two or more pulses having a delay between them based at least in part on the first number being greater than the second number.

5. The method of claim 4, further comprising:
generating one or more pulses having a magnitude based at least in part on the first number being greater than the second number.

6. The method of claim 4, further comprising:
generating one or more pulses having a polarity based at least in part on the first number being greater than the second number.

7. The method of claim 1, wherein calculating the remnant polarization level of the memory cell comprises:
calculating a slope of remnant polarization as a function of the access pulses of the plurality.

8. The method of claim 1, further comprising:
configuring a plurality of recovery pulses based at least in part on determining the fatigue state of the memory cell; and
applying the plurality of recovery pulses to the memory cell when the memory cell is in a recovery state.

9. The method of claim 8, further comprising:
calculating a second remnant polarization level of the memory cell based at least in part on the plurality of recovery pulses, the second remnant polarization level corresponding to a change in an amount of charge capable of being retained by the memory cell;
determining a maximum remnant polarization level of the memory cell after a polarity of the second remnant polarization level changes from a first value to a second value; and
terminating the plurality of recovery pulses based at least in part on determining the second remnant polarization level is equal to the maximum remnant polarization level of the memory cell.

10. The method of claim 8, further comprising:
monitoring the remnant polarization level of the memory cell based at least in part on applying the plurality of recovery pulses;
determining, based at least in part on monitoring the remnant polarization level of the memory cell, that the remnant polarization level of the memory cell is equal to or less than a third remnant polarization level of the memory cell in the fatigue state; and
terminating the plurality of recovery pulses based at least in part on determining that the remnant polarization level of the memory cell is equal to or less than the third remnant polarization level of the memory cell in the fatigue state.

11. The method of claim 1, further comprising:
configuring a plurality of recovery pulses to be applied to the memory cell based at least in part on determining the fatigue state of the memory cell and based at least in part on applying a predetermined number of access pulses to the memory cell after determining the fatigue state of the memory cell; and
applying the plurality of recovery pulses to the memory cell in a recovery state.

12. The method of claim 1, wherein the memory cell includes a ferroelectric capacitor configured to store an amount of charge corresponding to a remnant polarization.

13. A memory device, comprising:
a memory array; and
a controller in electronic communication with the memory array, wherein the controller is operable to:
apply a plurality of access pulses to a memory cell of the memory array;
calculating a remnant polarization level of the memory cell using the plurality of access pulses and an average delay between access operations, wherein the remnant polarization level corresponds to a reduced amount of charge capable of being retained by the memory cell based at least in part on a peak charge of the memory cell; and
determine a fatigue state of the memory cell based at least in part on calculating the remnant polarization level of the memory cell.

14. The memory device of claim 13, wherein the controller is further operable to:
perform a recovery operation configured to increase the remnant polarization level of the memory cell.

15. The memory device of claim 14, wherein the controller is further operable to:
perform the recovery operation as part of a background operation.

16. The memory device of claim 14, wherein the controller is further operable to:
perform the recovery operation based at least in part on a scheduled access operation for a first section of the memory array that comprises the memory cell; or
perform the recovery operation based at least in part on accessing a second section of the memory array, the second section being exclusive of the memory cell.

17. The memory device of claim 13, wherein the controller is further operable to:
configure a plurality of recovery pulses based at least in part on determining the fatigue state of the memory cell;
apply the plurality of recovery pulses to the memory cell;
determine that the remnant polarization level of the memory cell satisfies a condition based at least in part on applying the plurality of recovery pulses; and
terminate the plurality of recovery pulses based at least in part on determining the remnant polarization level of the memory cell satisfies the condition.

18. The memory device of claim 17, wherein the controller is further operable to:
calculate a second remnant polarization level of the memory cell as a function of the plurality of recovery pulses, the second remnant polarization level corresponding to a change in an amount of charge retained by the memory cell; and
determine a maximum remnant polarization level of the memory cell after a polarity of a remnant polarization of the memory cell corresponding to the second remnant polarization level changes from a positive value to a negative value; and
determine the second remnant polarization level of the memory cell satisfies the condition based at least in part on determining the maximum remnant polarization level of the memory cell.

19. The memory device of claim 17, wherein the controller is further operable to:
monitor the remnant polarization level of the memory cell based at least in part on applying the plurality of recovery pulses; and
determine, based at least in part on monitoring the remnant polarization level of the memory cell, that the remnant polarization level of the memory cell is equal to or greater than a remnant polarization of the memory cell in the fatigue state, wherein determining that the remnant polarization level of the memory cell satisfies the condition is based at least in part on determining the remnant polarization level of the memory cell is equal to or greater than the remnant polarization of the memory cell in the fatigue state.

20. An electronic memory apparatus, comprising:
a memory cell; and
a controller in electronic communication with the memory cell, wherein the controller is operable to:
apply a plurality of access pulses to the memory cell;
determine, based at least in part on a peak charge of the memory cell, a fatigue state of the memory cell after a polarity of a remnant polarization of the memory cell changes as a function of the plurality of access pulses and an average delay between access operations;
apply a plurality of recovery pulses to the memory cell based at least in part on determining the fatigue state of the memory cell;
determine that the remnant polarization of the memory cell satisfies a condition based at least in part on applying the plurality of recovery pulses to the memory cell; and
terminate the plurality of recovery pulses based at least in part on determining the remnant polarization of the memory cell satisfies the condition.

\* \* \* \* \*